United States Patent
Jiang et al.

(10) Patent No.: US 12,416,858 B2
(45) Date of Patent: Sep. 16, 2025

(54) OPTICAL DEVICE WITH ELEMENTS HAVING OUTWARDLY-CURVED OPPOSING LEADING EDGES SPACED ACCORDING TO A DUTY CYCLE, PITCH, AND CRITICAL DIMENSION

(71) Applicant: Applied Materials, Inc., Santa Clara, CA (US)

(72) Inventors: Jing Jiang, Santa Clara, CA (US); Jinxin Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 859 days.

(21) Appl. No.: 17/227,065

(22) Filed: Apr. 9, 2021

(65) Prior Publication Data
US 2022/0221788 A1 Jul. 14, 2022

Related U.S. Application Data

(60) Provisional application No. 63/136,956, filed on Jan. 13, 2021.

(51) Int. Cl.
*G03F 7/00* (2006.01)
*G02B 6/124* (2006.01)
(Continued)

(52) U.S. Cl.
CPC ........... *G03F 7/0005* (2013.01); *G02B 6/124* (2013.01); *G02B 6/136* (2013.01);
(Continued)

(58) Field of Classification Search
CPC ......... G03F 7/0005; G03F 1/00; G02B 6/124; G02B 27/0172; G02B 2006/12107; G02B 2006/12173
See application file for complete search history.

(56) References Cited

U.S. PATENT DOCUMENTS 4,967,286 A * 10/1990 Nomula ............. G11B 7/24094
386/326
5,262,893 A * 11/1993 Shrauger ............. G02B 5/1885
430/321
(Continued)

FOREIGN PATENT DOCUMENTS

WO    2017139245 A1    8/2017

OTHER PUBLICATIONS

PCT Notification of Transmittal of the International Search Report and the Written Opinion of the International Searching Authority for International Application No. PCT/US2021/063092; dated Jun. 7, 2022.

(Continued)

*Primary Examiner* — Andrew Jordan
(74) *Attorney, Agent, or Firm* — Patterson + Sheridan, LLP (57) ABSTRACT

Embodiments described herein provide for methods of forming optical device structures having continuously increasing or decreasing duty cycles. One embodiment includes a device. The device includes a plurality of optical device structures. Each optical device structure of the plurality of optical device structures includes a plurality of discrete zones. Each discrete zone of the plurality of discrete zones has a critical dimension. The device further includes a plurality of transition zones disposed between two discrete zones of the plurality of discrete zones. The critical dimension of each transition zone of the plurality of transition zones continuously increases or decreases across a length of each optical device structure of the plurality of optical device structures.

20 Claims, 6 Drawing Sheets

(51) Int. Cl.
  *G02B 6/136* (2006.01)
  *G02B 27/01* (2006.01)
  *G02B 6/12* (2006.01)

(52) U.S. Cl.
  CPC ............ *G02B 27/0172* (2013.01); *G02B 2006/12107* (2013.01); *G02B 2006/12173* (2013.01)

(56) References Cited

U.S. PATENT DOCUMENTS

| | | | |
|---|---|---|---|
| 6,924,870 B1 * | 8/2005 | Wang | G02B 5/1833 349/86 |
| 10,429,588 B1 | 10/2019 | Yoo et al. | |
| 10,444,419 B2 | 10/2019 | Bhargava et al. | |
| 11,194,086 B2 * | 12/2021 | Fattal | G02B 30/33 |
| 11,614,685 B2 * | 3/2023 | Godet | G02B 6/34 216/24 |
| 11,656,473 B2 * | 5/2023 | Takata | G02B 6/0036 359/630 |
| 12,032,167 B2 * | 7/2024 | Sato | G02B 27/0172 |
| 12,111,421 B2 * | 10/2024 | Soskind | G02F 1/292 |
| 2008/0032208 A1 | 2/2008 | Kim et al. | |
| 2008/0038660 A1 * | 2/2008 | Doneda | G02B 6/124 430/296 |
| 2011/0019258 A1 * | 1/2011 | Levola | G02B 27/0081 359/238 |
| 2012/0269483 A1 | 10/2012 | Mossberg et al. | |
| 2015/0086153 A1 | 3/2015 | Ono et al. | |
| 2015/0121317 A1 * | 4/2015 | Lee | G03F 1/00 716/52 |
| 2016/0025931 A1 | 1/2016 | Bogaerts | |
| 2018/0329115 A1 | 11/2018 | Kildishev et al. | |
| 2019/0187478 A1 * | 6/2019 | Yoshida | G02B 27/0172 |
| 2020/0264367 A1 | 8/2020 | Huang et al. | |
| 2020/0379158 A1 * | 12/2020 | Blomstedt | G02B 27/0172 |
| 2020/0379260 A1 * | 12/2020 | Blomstedt | G02B 27/4205 |
| 2020/0393609 A1 * | 12/2020 | Blomstedt | G02B 6/0058 |
| 2022/0221788 A1 * | 7/2022 | Jiang | G03F 1/00 |

OTHER PUBLICATIONS

Habibullah Yusuf B. et al., Second-harmonic generation from complementary Au metasurfaces with triangular resonators, Journal of the Optical Society of America—B., vol. 36, No. 4, Mar. 29, 2019 (Mar. 29, 2019), p. 1166, XP093217632, us ISSN: 0740-3224, DOI: 10.1364/JOSAB.36.001166 Retrieved from the Internet: URL:https://opg.optica.org/view_article.cfm?pdfKey=df98cfe6-d5cc-4c00-8705f738cfa 15aad 408028.

Extended European Search Report for European Application No. 21920066.4 dated Nov. 13, 2024.

* cited by examiner

OPTICAL DEVICE WITH ELEMENTS HAVING OUTWARDLY-CURVED OPPOSING LEADING EDGES SPACED ACCORDING TO A DUTY CYCLE, PITCH, AND CRITICAL DIMENSION

CROSS-REFERENCE TO RELATED APPLICATIONS

This application claims priority from U.S. Application Ser. No. 63/136,956, filed Jan. 13, 2021, which is hereby incorporated by reference in its entirety.

BACKGROUND

Field

Embodiments of the present disclosure generally relate to optical devices for augmented, virtual, and mixed reality. More specifically, embodiments described herein provide for methods of forming optical device structures having continuously increasing or decreasing duty cycles.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhance or augment the environment that the user experiences. As an emerging technology, there are many challenges and design constraints with augmented reality.

One such challenge is displaying a virtual image overlaid on an ambient environment. Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment. Optical device structures of the optical devices include multiple discrete zones. However, light is lost by the sudden transition between two discrete zones and therefore decreases the optical performance of the optical devices.

Accordingly, what is needed in the art are improved methods of forming optical device structures having continuously increasing or decreasing duty cycles.

SUMMARY

In one embodiment, a device is provided. The device includes a plurality of optical device structures. The plurality of optical device structures have a critical dimension across a length of each optical device structure of the plurality of optical device structures. Each optical device structure of the plurality of optical device structures includes a plurality of discrete zones. The device further includes a plurality of transition zones disposed between two discrete zones of the plurality of discrete zones. The critical dimension of each transition zone of the plurality of transition zones continuously increases or decreases across the length of each optical device structure of the plurality of optical device structures.

In another embodiment, a device is provided. The device includes a plurality of optical device structures. The plurality of optical device structures have a critical dimension across a length of each optical device structure of the plurality of optical device structures. Each optical device structure of the plurality of optical device structures includes a plurality of discrete zones. The device further includes a plurality of transition zones disposed between two discrete zones of the plurality of discrete zones. The critical dimension of each transition zone of the plurality of transition zones continuously increases or decreases across the length of each optical device structure of the plurality of optical device structures. Adjacent optical device structures of the plurality of optical device structures include a pitch. The device further includes a duty cycle defined as the critical dimension of the plurality of optical device structures divided by the pitch. The duty cycle continuously increases or decreases across the length of each optical device structure of the plurality of optical device structures.

In yet another embodiment, a method is provided. The method includes editing a design file. The design file corresponds to a mask. The mask includes a plurality of openings. The plurality of openings have a width that continuously increases or decreases across a length of the plurality of openings. The method further includes generating the mask. The mask is to be disposed over a photoresist disposed over a substrate. The method further includes passing light through the plurality of openings of the mask positioned over the photoresist. The method further includes developing the photoresist to form a patterned photoresist. The patterned photoresist corresponds to the plurality of openings of the mask. The method further includes patterning the substrate or a device material to form a plurality of optical device structures. The optical device structures correspond to the plurality of openings of the mask. The plurality of optical device structures have a critical dimension that continuously increases or decreases across a length of the plurality of optical device structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices for augmented, virtual, and mixed reality. More specifically, embodiments described herein provide for methods of forming optical device structures having continuously increasing or decreasing duty cycles. In one embodiment, a device is provided. The device includes a plurality of optical device structures. The plurality of optical device structures have a critical dimension across a length of each optical device structure of the plurality of optical device structures. Each optical device structure of the plurality of optical device structures includes a plurality of discrete zones. The device further includes a plurality of transition zones disposed between two discrete zones of the plurality of discrete zones. The critical dimension of each transition zone of the plurality of transition zones continuously increases or decreases across the length of each optical device structure of the plurality of optical device structures.

Figure 1:
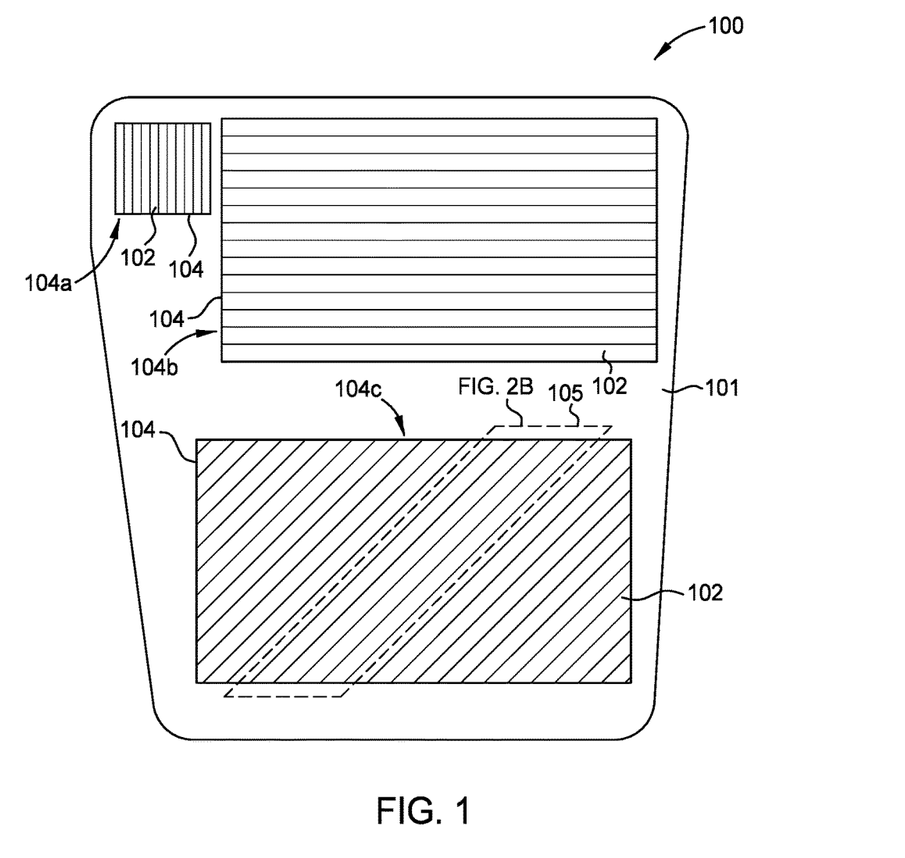
FIG. 1 is a perspective, frontal view of an optical device according to embodiments described herein.

FIG. 1 illustrates a perspective, frontal view of an optical device 100. In one embodiment, which can be combined with other embodiments described herein, the optical device 100 is a waveguide combiner, such as an augmented reality waveguide combiner. In another embodiment, which can be combined with other embodiments described herein, the optical device 100 is a flat optical device, such as a meta-surface. The optical device 100 includes a plurality of optical device structures 102 disposed in or on a substrate 101. The optical device structures 102 may be nanostructures having sub-micron dimensions, e.g., nano-sized dimensions, such as critical dimensions less than 1 µm. In one embodiment, which can be combined with other embodiments described herein, regions of the plurality of optical device structures 102 correspond to one or more gratings 104, such as a first grating 104a, a second grating 104b, and a third grating 104c. In one embodiment, which can be combined with other embodiments described herein, the optical device 100 is a waveguide combiner that includes at least the first grating 104a corresponding to an input coupling grating and the third grating 104c corresponding to an output coupling grating. The waveguide combiner according to the embodiment, which can be combined with other embodiments described herein, may include the second grating 104b corresponding to an intermediate grating. A portion 105 of the optical device 100 is further described in FIG. 2B.

In one embodiment, which can be combined with other embodiments described herein, the optical device 100 is a master for an imprint process, such as a nano-imprint lithography process. In another embodiment, which can be combined with other embodiments described herein, the optical device 100 is patterned directly, such as via a direct etch process. As described herein, the optical device 100 is one of a master pattern of a master for an imprint process for optical device fabrication (e.g., nano-imprint lithography using a master to form an optical device) or an optical device (e.g., a waveguide combiner and flat optical device). As described herein, the optical device 100 is formed from at least one of a device material or substrate.

In some embodiments, which can be combined with other embodiments described herein, the plurality of optical device structures 102 can be formed from the substrate 101. The substrate 101 may be formed from any suitable material, provided that the substrate 101 can adequately transmit light in a desired wavelength or wavelength range and can serve as an adequate support for the optical device 100, described herein. In some embodiments, which can be combined with other embodiments described herein, the material of the substrate 101 has a refractive index that is relatively low, as compared to the refractive index of the plurality of optical device structures 102. Substrate selection may include substrates of any suitable material, including, but not limited to, amorphous dielectrics, non-amorphous dielectrics, crystalline dielectrics, silicon oxide, polymers, and combinations thereof. In some embodiments, which may be combined with other embodiments described herein, the substrate 101 includes a transparent material. In one example, the substrate 101 includes silicon (Si), silicon dioxide ($SiO_2$), germanium (Ge), silicon germanium (SiGe), InP, GaAs, GaN, fused silica, quartz, sapphire, and high-index transparent materials such as high-refractive-index glass.

In some embodiments, which can be combined with other embodiments described herein, the plurality of optical device structures 102 can be formed from a device material. The device material is disposed over the substrate 101. The device material includes, but is not limited to, one or more of silicon carbide (SiC), silicon oxycarbide (SiOC), titanium dioxide ($TiO_2$), silicon dioxide ($SiO_2$), vanadium (IV) oxide (VOx), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), silicon carbon-nitride (SiCN) containing materials, combinations thereof, or other suitable materials.

Figure 2A:
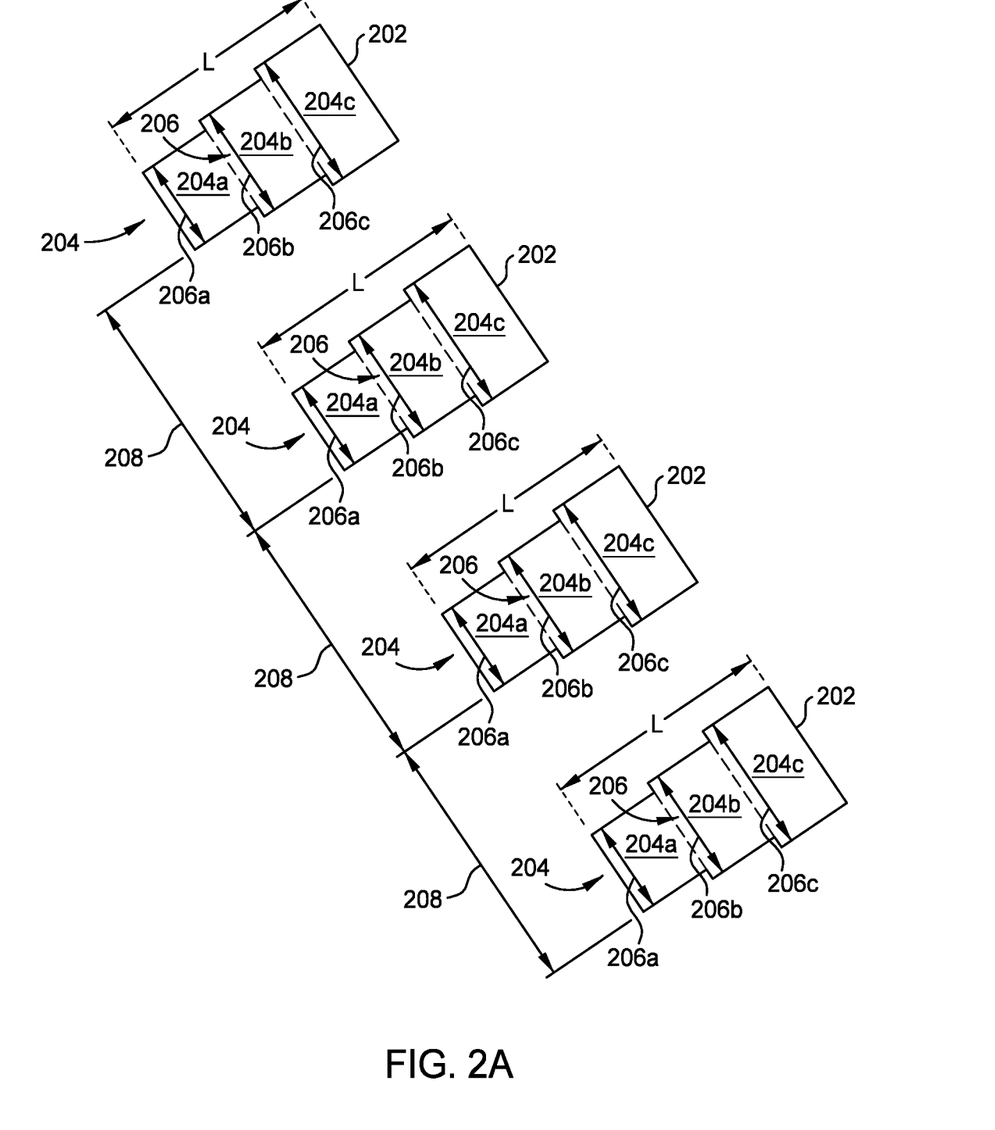
FIGS. 2A and 2B are schematic, top-views of a plurality of optical device structures according to embodiments described herein.

FIG. 2A is a schematic, top-view of a plurality of optical device structures 202 according to embodiments described herein. The plurality of optical device structures 202 include a plurality of discrete zones 204. As shown in FIG. 2A, the plurality of optical device structures 202 have a first discrete zone 204a, a second discrete zone 204b, and a third discrete zone 204c. Although only three discrete zones 204 of the plurality of discrete zones 204 are shown, more than three discrete zones 204 may be included in the plurality of optical device structures 202. The plurality of optical device structures 202 may be parallel, normal, or angled with respect to the boundaries between adjacent discrete zones 204 of the plurality of discrete zones 204.

The plurality of discrete zones 204 have a critical dimension 206. The critical dimension 206 is the width of each of the plurality of optical device structures 202. In one embodiment, which can be combined with other embodiments described herein, the first discrete zone 204a has a first critical dimension 206a, the second discrete zone 204b has a second critical dimension 206b, and the third discrete zone 204c has a third critical dimension 206c. In one embodiment, which can be combined with other embodiments described herein, the critical dimension 206 is between about 40 nm and about 380 nm.

Adjacent optical device structures 202 of the plurality of optical device structures 202 have a pitch 208. The pitch 208 is the distance between leading edges of the adjacent optical device structures 202. The pitch 208 between adjacent optical device structures 202 remains constant across a length L of the plurality of optical device structures 202. In one embodiment, which can be combined with other embodiments described herein, the pitch 208 is between about 280 nm and about 450 nm.

Adjacent optical device structures 202 of the plurality of optical device structures 202 have a duty cycle. The duty cycle is determined by dividing the critical dimension 206 of the optical device structure 202 by the pitch 208. Therefore, the plurality of discrete zones 204 have different duty cycles. The duty cycle changes across the length L of the plurality of optical device structures 202 as the critical dimension 206 is changed. In one embodiment, which can be combined with other embodiments described herein, the duty cycle of the plurality of discrete zones 204 is between about 0.2 to about 0.85. The difference in the duty cycle between adjacent discrete zones 204 of the plurality of discrete zones 204 is greater than 0.01. The critical dimension 206 of each discrete zone 204 of the plurality of discrete zones 204 is constant across the entire zone. The difference in the critical dimensions 206 and the duty cycle between the plurality of discrete zones 204 results in decreased optical device performance.

Figure 2B:
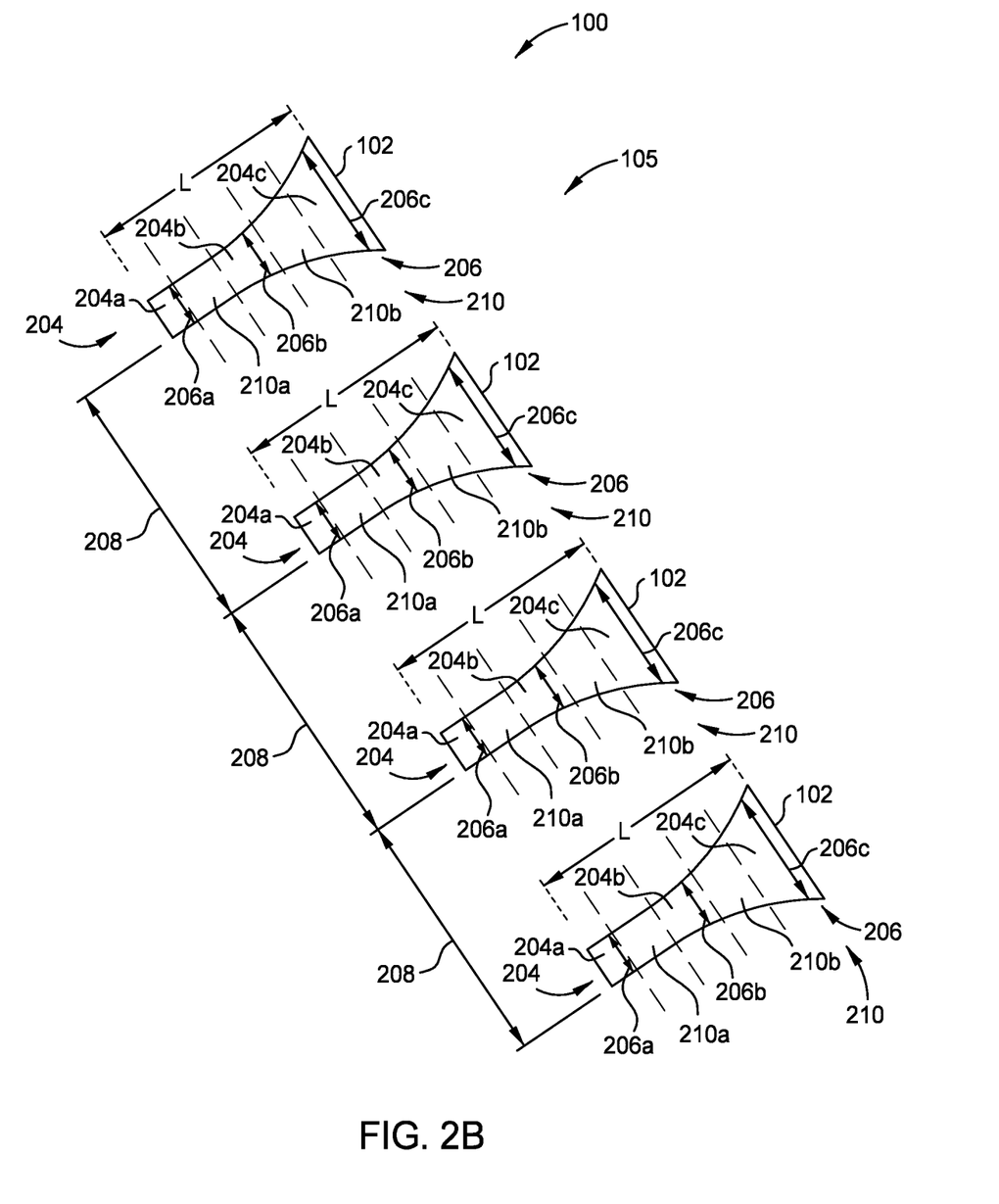

FIG. 2B is a schematic, top-view of a plurality of optical device structures 102 of a portion 105 of an optical device 100. In one embodiment, which can be combined with other embodiments described herein, the plurality of optical device structures 102 are of a flat optical device, such as a metasurface. In another embodiment, which can be combined with other embodiments described herein, the plurality of optical device structures 102 are of a waveguide combiner, such as an augmented reality waveguide combiner. The waveguide combiner according to the embodiment, which can be combined with other embodiments described herein, may include the plurality of optical device structures 102 in at least one of the gratings 104. In yet another embodiment, which can be combined with other embodiments described herein, the plurality of optical device structures 102 correspond to the first grating 104a, the second grating 104b, or the third grating 104c of the optical device 100. Although only four of the plurality of optical device structures 102 are shown, one or more of the plurality of optical device structures 102 may be disposed on the optical device 100.

The plurality of optical device structures 102 have a critical dimension 206. The critical dimension 206 is the width of each of the plurality of optical device structures 202. The plurality of optical device structures 102 include a plurality of discrete zones 204. As shown in FIG. 2B, the plurality of optical device structures 102 have a first discrete zone 204a, a second discrete zone 204b, and a third discrete zone 204c. Although three discrete zones 204 are shown in FIG. 2B, more than three discrete zones 204 may be included on the plurality of optical device structures 102. The first discrete zone 204a has a first critical dimension 206a, the second discrete zone 204b has a second critical dimension 206b, and the third discrete zone 204c has a third critical dimension 206c. In one embodiment, which can be combined with other embodiments described herein, each discrete zone 204 of the plurality of discrete zones 204 has a critical dimension 206 that continuously increases or decreases across a length L of the plurality of optical device structures 102. In one example of this embodiment, as shown in FIG. 2B, the first critical dimension 206a, the second critical dimension 206b, and the third discrete zone 204c increase across the length L of the plurality of optical device structures 102. In some embodiments, as shown in FIG. 2B, the plurality of optical device structures 102 may have a leading edge and a trailing edge opposite the leading edge. In some embodiments, each leading edge and each trailing edge curve outward in an opposite direction from each other along a length L of the plurality of optical device structures 102.

The plurality of optical device structures 102 further include a plurality of transition zones 210. The plurality of transition zones 210 are disposed between two discrete zones 204 of the plurality of discrete zones 204. In one embodiment, which can be combined with other embodiments described herein, a first transition zone 210a is disposed between the first discrete zone 204a and the second discrete zone 204b. A second transition zone 210b is disposed between the second discrete zone 204b and the third discrete zone 204c. Although two transition zones 210 are shown in FIG. 2B, more than two transition zones 210 may be included on the plurality of optical device structures 102.

In one embodiment, which can be combined with other embodiments described herein, the critical dimension 206 in the plurality of transition zones 210 continuously increases or decreases across the length L of the plurality of optical device structures 102. For example, the critical dimension 206 continuously increases from the first critical dimension 206a to the second critical dimension 206b in the first transition zone 210a. Additionally, the critical dimension 206 continuously increases from the second critical dimension 206b to the third critical dimension 206c in the second transition zone 210b.

Adjacent optical device structures 102 of the plurality of optical device structures 102 have a pitch 208. The pitch 208 is the distance between leading edges of the adjacent optical device structures 102. The pitch 208 between adjacent optical device structures 102 remains constant across the length L of the plurality of optical device structures 102. In one embodiment, which can be combined with other embodiments described herein, the pitch 208 is between about 280 nm and about 450 nm.

Adjacent optical device structures 102 of the plurality of optical device structures 102 have a duty cycle. The duty cycle is determined by dividing the critical dimension 206 of the optical device structure 102 by the pitch 208. In other words, the duty cycle is defined as the critical dimension 206 of the plurality of optical device structures 102 divided by the pitch of adjacent optical device structures 102 of the plurality of optical device structures 102. The duty cycle increases or decreases across the length L of the plurality of optical device structures 102 as the critical dimension 206 is changed. Therefore, as shown in FIG. 2B, the duty cycle will continuously increase or decrease across the length L. The critical dimension 206 of the plurality of optical device structures 102 continuously increasing or decreasing across the length L improves the optical performance of the optical device 100.

Figure 3A:
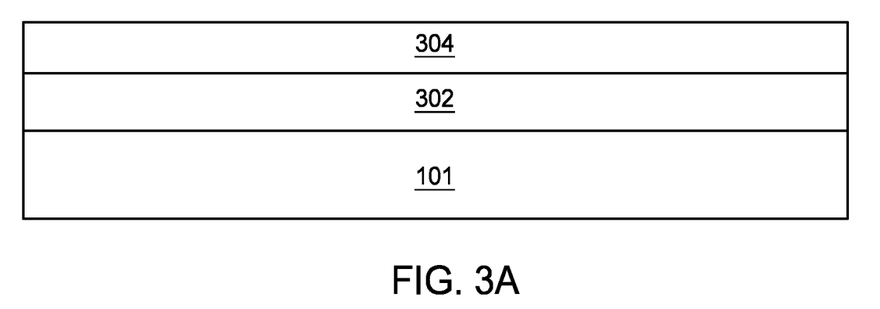
FIGS. 3A and 3B are schematic, cross-sectional views of a substrate according to embodiments described herein.
Figure 3B:
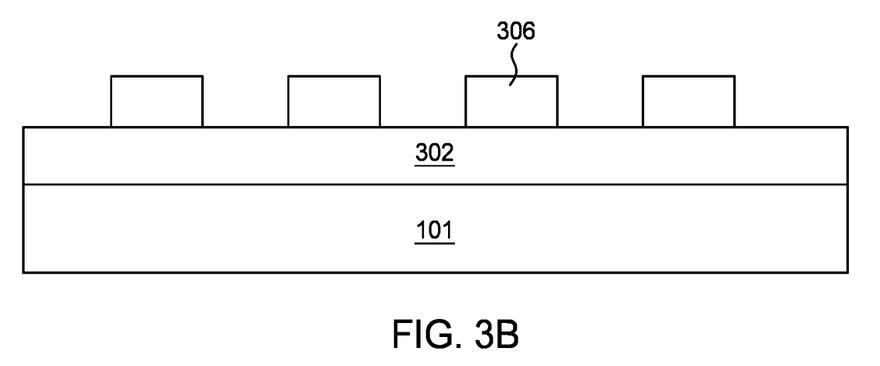
Figure 4:
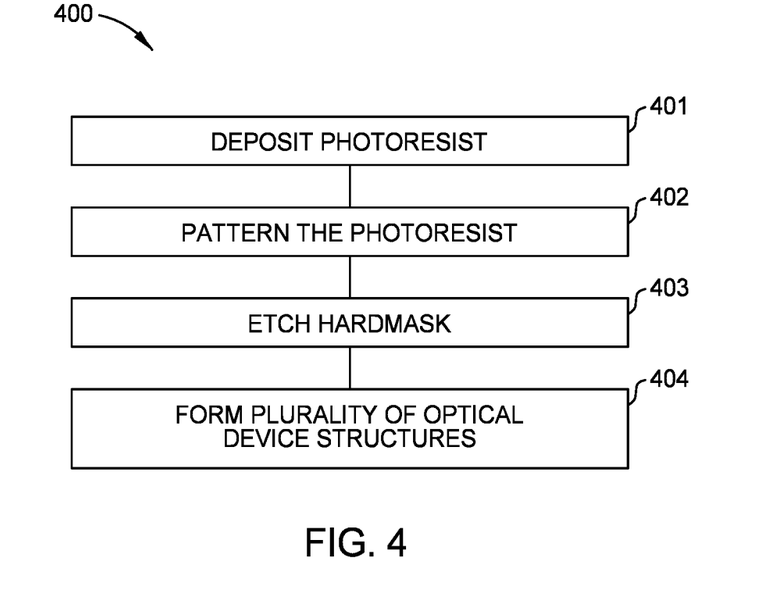
FIG. 4 is a flow diagram of a method for forming a plurality of optical device structures according to embodiments described herein.

FIGS. 3A and 3B schematic, cross-sectional views of a substrate 101. FIG. 4 is a flow diagram of a method 400 for forming a plurality of optical device structures 102. At operation 401, as shown in FIG. 3A, a photoresist 304 is deposited. The photoresist 304 is deposited over a hardmask 302. The photoresist 304 is sensitive to electromagnetic radiation. The photoresist 304 can be a positive or negative photoresist.

A positive photoresist includes portions of the photoresist 304 that, when exposed to radiation, are respectively soluble to a photoresist developer applied to the photoresist 304 after the pattern is written into the photoresist 304 using the electromagnetic radiation. A negative photoresist includes portions of the photoresist 304 that, when exposed to radiation, will be respectively insoluble to the photoresist developer applied to the photoresist 304 after the pattern is written into the photoresist 304 using the electromagnetic radiation. The chemical composition of the photoresist 304 determines whether the photoresist is a positive photoresist or negative photoresist. Examples of the photoresist 304 include, but are not limited to, at least one of diazonaphthoquinone, a phenol formaldehyde resin, poly(methyl methacrylate), poly(methyl glutarimide), and SU-8. The hardmask 302 includes, but is not limited to, silicon, silicon nitride (SiN), SiO, low-k, SiC, SiOC, SiCONH, TaO, BPSG, PSG, dielectrics, spin on glass (SOG), or metallic alloys such as TiN.

Figure 3C:
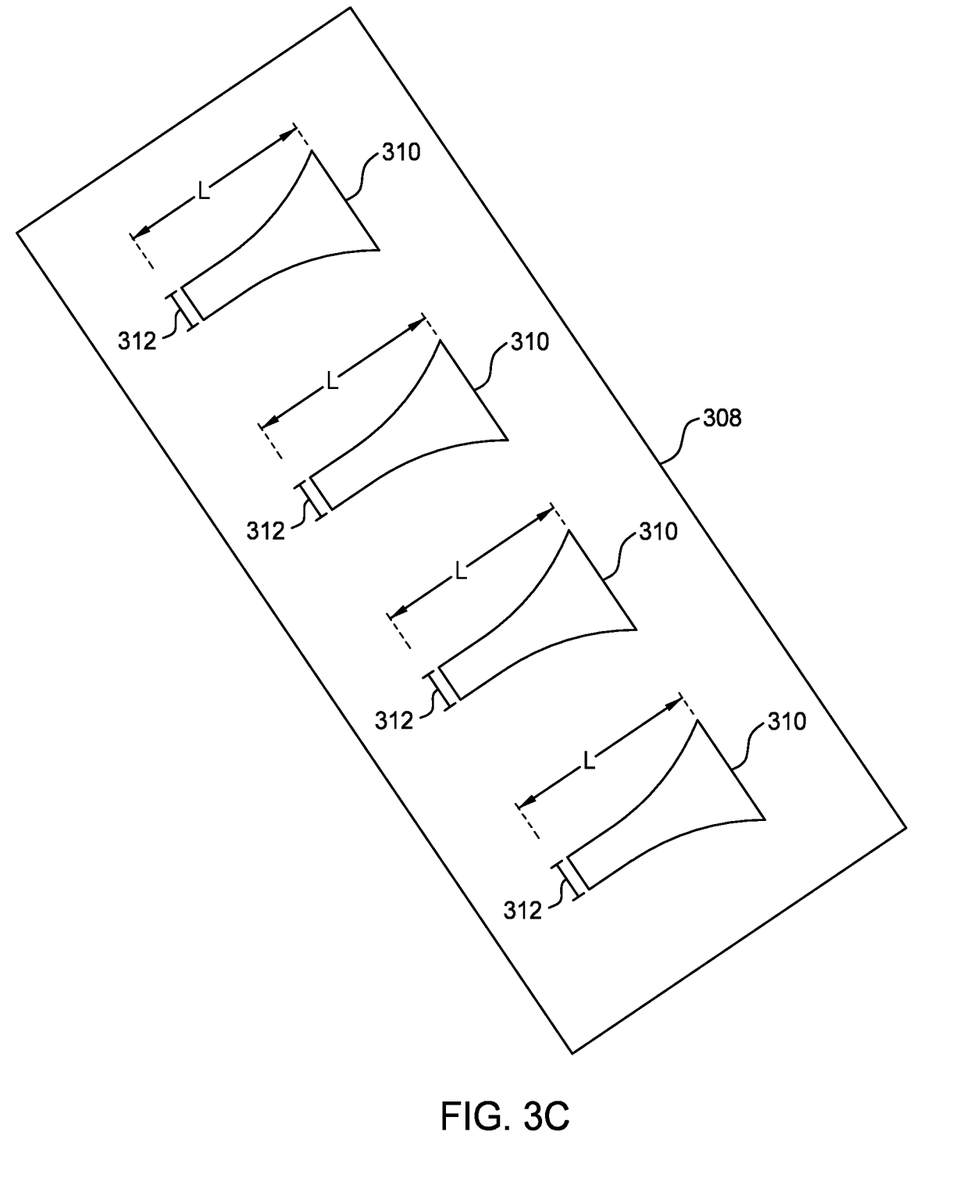
FIG. 3C is a schematic, top-view of a mask according to embodiments described herein.

At operation 402, as shown in FIG. 3B, the photoresist 304 is patterned. Prior to patterning the photoresist 304, a design file is edited. FIG. 3C is a schematic, top-view of a mask 308. As shown in FIG. 3C, the design file corresponds to the mask 308 to be developed. The design file is edited such that the mask 308 will include a width 312 of a plurality of openings 310 that continuously increases or decreases across a length L. In one embodiment, which can be combined with other embodiments described herein, an optical proximity correction (OPC) step is performed on the design file. The OPC step is utilized to meet a critical dimension 206 of a plurality of discrete zones 204 and the critical dimension 206 of a plurality of transition zones 210.

The mask 308 is generated. The mask 308 is generated with the plurality of openings 310 corresponding to the plurality of optical device structures 102 to be patterned. Light passes through the plurality of openings 310 in the mask 308 to expose the photoresist 304 to electromagnetic radiation. The plurality of openings 310 have identical or substantially identical shapes as the plurality of optical device structures 102 to be patterned. The width 312 corresponds to the critical dimension 206 of the plurality of optical device structures 102. In one embodiment, which can be combined with other embodiments described herein, the width 312 of each opening 310 of the plurality of openings 310 is larger than the critical dimension 206 at the corresponding point along the length L. The width 312 of each opening 310 of the plurality of openings 310 is larger than the critical dimension 206 at the corresponding point along the length L to account for a decrease of the critical dimension 206 compared to the width 312 during the method 400. For example, a patterned photoresist 306 to be formed after light is passed through the plurality of openings 310 will have smaller dimensions than the width 312 of each opening 310. In another embodiment, which can be combined with other embodiments described herein, the width 312 of each opening 310 of the plurality of openings 310 is smaller than the critical dimension 206 at the corresponding point along the length L.

As shown in FIG. 3B, after exposure of the photoresist 304 to the electromagnetic radiation, the photoresist 304 is developed to leave a patterned photoresist 306 on the hardmask 302. At operation 403, the hardmask 302 is etched. Using the patterned photoresist 306, the hardmask 302 is pattern etched through the openings in the patterned photoresist 306. The hardmask 302 includes, but is not limited to, silicon nitride (SiN), SiO, low-k, SiC, SiOC, SiCONH, TaO, BPSG, PSG, dielectrics, or metallic alloys such as TiN.

At operation 404, the plurality of optical device structures 102 are formed. The plurality of optical device structures 102 are formed by etching the substrate 101. In one embodiment, which can be combined with other embodiments described herein, the plurality of optical device structures 102 are formed by etching a device material disposed on the substrate 101. The substrate 101 or the device material is pattern etched through the openings in the hardmask 302. As shown in FIG. 2B, the plurality of optical device structures 102 includes a plurality of discrete zones 204 and a plurality of transition zones 210. In one embodiment, which can be combined with other embodiments described herein, a critical dimension 206 continuously increases or decreases across a length L of the plurality of optical device structures. Additionally, the duty cycle between the plurality of discrete zones 204 and the plurality of transition zones 210 continuously increases or decreases across the length L.

In summation, methods of forming optical device structures having continuously increasing or decreasing duty cycles are disclosed. The optical device structures each have a plurality of transition zones disposed between two discrete zones. The critical dimensions of each transition zone of the plurality of transition zones continuously increase or decrease across a length of each optical device structure. Adjacent optical device structures include a constant pitch. A duty cycle defined as the critical dimension of the plurality of optical device structures divided by the pitch continuously increases or decreases across the length of each optical device structure. The continuous increasing or decreasing across the length of each optical device structure improves the optical performance of the optical device structures. The performance is improved as the continuous transition between two discrete zones allows for the light to be propagated more efficiently in the optical devices.

While the foregoing is directed to embodiments of the present disclosure, other and further embodiments of the disclosure may be devised without departing from the basic scope thereof, and the scope thereof is determined by the claims that follow.

What is claimed is:
1. A device, comprising:
a plurality of optical device structures, each optical device structure having a leading edge and a trailing edge opposite the leading edge, wherein each leading edge and each trailing edge curve outward in an opposite direction from each other along a length of each optical device structure, the plurality of optical device structures having a critical dimension across the length of each optical device structure of the plurality of optical device structures, each optical device structure of the plurality of optical device structures having:
a plurality of discrete zones;
a plurality of transition zones disposed between two discrete zones of the plurality of discrete zones, the critical dimension of each transition zone of the plurality of transition zones continuously increasing or decreasing across the length of each optical device structure of the plurality of optical device structures; and
a duty cycle defined as the critical dimension of the plurality of optical device structures divided by a pitch of adjacent optical device structures of the plurality of optical device structures, the duty cycle continuously increasing or decreasing across the length of each optical device structure of the plurality of optical device structures,
wherein the pitch is a distance between leading edges of the adjacent optical device structures and the pitch remains constant across the length of each optical device structure of the adjacent optical device structures, and wherein the critical dimension is a width of each optical device structure of the plurality of optical device structures.

2. The device of claim 1, wherein the plurality of optical device structures correspond to one or more gratings or a master pattern of a master.

3. The device of claim 2, wherein the one or more gratings include an input coupling grating, an output coupling grating, and an intermediate grating.

4. The device of claim 1, wherein the pitch is between about 280 nm and about 450 nm.

5. The device of claim 1, wherein the plurality of optical device structures are formed on a substrate, the substrate includes one or more of silicon (Si), silicon dioxide ($SiO_2$), germanium (Ge), silicon germanium (SiGe), InP, GaAs, GaN, fused silica, quartz, sapphire, or high-index transparent materials.

6. The device of claim 1, wherein the plurality of optical device structures are formed from a device material, the device material includes one or more of silicon carbide (SiC), silicon oxycarbide (SiOC), titanium dioxide ($TiO_2$), silicon dioxide ($SiO_2$), vanadium (IV) oxide (VOx), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), or silicon carbon-nitride (SiCN) containing materials.

7. The device of claim 1, wherein a first critical dimension, a second critical dimension, and a third critical dimension of the plurality of discrete zones increase or decrease across the length of the plurality of optical device structures.

8. A device, comprising:
a plurality of optical device structures, each optical device structure having a leading edge and a trailing edge opposite the leading edge, wherein each leading edge and each trailing edge curve outward in an opposite direction from each other along a length of each optical device structure, the plurality of optical device structures having a critical dimension across the length of each optical device structure of the plurality of optical device structures, each optical device structure of the plurality of optical device structures having:
a plurality of discrete zones;
a plurality of transition zones disposed between two discrete zones of the plurality of discrete zones, the critical dimension of each transition zone of the plurality of transition zones continuously increasing or decreasing across the length of each optical device structure of the plurality of optical device structures, adjacent optical device structures of the plurality of optical device structures including a pitch; and
a duty cycle defined as the critical dimension of the plurality of optical device structures divided by the pitch, the duty cycle continuously increasing or decreasing across the length of each optical device structure of the plurality of optical device structures,
wherein the critical dimension is defined by a width of each optical device structure of the plurality of optical device structures,
wherein the pitch is a distance between leading edges of the adjacent optical device structures and the pitch remains constant across the length of each optical device structure of the adjacent optical device structures, and
wherein the critical dimension of at least one discrete zone of the plurality of discrete zones is constant across the length of the discrete zone.

9. The device of claim 8, wherein the plurality of optical device structures correspond to one or more gratings or a master pattern of a master.

10. The device of claim 8, wherein the pitch is between about 280 nm and about 450 nm.

11. A method, comprising:
editing a design file, the design file corresponding to a mask, the mask including a plurality of openings, the plurality of openings having a width that continuously increases or decreases across a length of the plurality of openings;
generating the mask, the mask to be disposed over a photoresist disposed over a substrate;
passing light through the plurality of openings of the mask positioned over the photoresist;
developing the photoresist to form a patterned photoresist, the patterned photoresist corresponding to the plurality of openings of the mask; and
patterning the substrate or a device material to form a plurality of optical device structures, each optical device structure having a leading edge and a trailing edge opposite the leading edge, wherein each leading edge and each trailing edge curve outward in an opposite direction from each other along a length of each optical device structure, the optical device structures corresponding to the plurality of openings of the mask, the plurality of optical device structures having a critical dimension that continuously increases or decreases across the length of each optical device structure of the plurality of optical device structures, each optical device structure of the plurality of optical device structures having:
a plurality of discrete zones;
a plurality of transition zones disposed between two discrete zones of the plurality of discrete zones, the critical dimension of each transition zone of the plurality of transition zones continuously increasing or decreasing across the length of each optical device structure of the plurality of optical device structures; and
a duty cycle defined as the critical dimension of the plurality of optical device structures divided by a pitch of adjacent optical device structures of the plurality of optical device structures, the duty cycle continuously increasing or decreasing across the length of each optical device structure of the plurality of optical device structures,
wherein the pitch is a distance between leading edges of the adjacent optical device structures and the pitch remains constant across the length of each optical device structure of the adjacent optical device structures, and
wherein the critical dimension is a width of each optical device structure of the plurality of optical device structures.

12. The method of claim 11, wherein the photoresist is disposed on a hardmask, the hardmask disposed on a substrate.

13. The method of claim 12, wherein the device material is disposed between the substrate and the hardmask.

14. The method of claim 13, further comprising pattern etching the hardmask through openings in the patterned photoresist.

15. The method of claim 14, wherein the device material includes one or more of silicon carbide (SiC), silicon oxycarbide (SiOC), titanium dioxide (TiO$_2$), silicon dioxide (SiO$_2$), vanadium (IV) oxide (VOx), aluminum oxide (Al$_2$O$_3$), aluminum-doped zinc oxide (AZO), indium tin oxide (ITO), tin dioxide (SnO$_2$), zinc oxide (ZnO), tantalum pentoxide (Ta$_2$O$_5$), silicon nitride (Si$_3$N$_4$), zirconium dioxide (ZrO$_2$), niobium oxide (Nb$_2$O$_5$), cadmium stannate (Cd$_2$SnO$_4$), or silicon carbon-nitride (SiCN) containing materials.

16. The method of claim 11, wherein the substrate includes one or more of silicon (Si), silicon carbide (SiC), silicon dioxide (SiO$_2$), germanium (Ge), silicon germanium (SiGe), InP, GaAs, GaN, fused silica, quartz, sapphire, or high-index transparent materials.

17. The method of claim 11, wherein the plurality of optical device structures correspond to one or more gratings or a master pattern of a master.

18. The method of claim 17, wherein the one or more gratings include an input coupling grating, an output coupling grating, and an intermediate grating.

19. The method of claim 11, wherein the pitch is between about 280 nm and about 450 nm.

20. The method of claim 11, wherein the width of each opening of the plurality of openings is larger than the critical dimension at a corresponding point of the length of each optical device structure.

* * * * *